United States Patent
Chen

(10) Patent No.: US 6,858,866 B2
(45) Date of Patent: Feb. 22, 2005

(54) III-NITRIDE LIGHT EMITTING DIODE

(75) Inventor: Shi-Ming Chen, No. 10, Da-Shuen 9th Rd., Tainan Science-Based Industrial Park, Hsinshi Tainan County (TW)

(73) Assignees: Epitech Corporation, Ltd., Tainan (TW); Shi-Ming Chen, Tainan (TW)

( * ) Notice: Subject to any disclaimer, the term of this patent is extended or adjusted under 35 U.S.C. 154(b) by 10 days.

(21) Appl. No.: 10/061,241

(22) Filed: Feb. 4, 2002

(65) Prior Publication Data

US 2003/0127644 A1 Jul. 10, 2003

(30) Foreign Application Priority Data

Jan. 10, 2002 (TW) ......................................... 91100270 A

(51) Int. Cl.[7] .......................... H01L 27/15; H01L 33/00
(52) U.S. Cl. ...................... 257/44; 257/103; 257/613; 257/615; 257/79; 257/99
(58) Field of Search .............................. 257/103, 613, 257/615, 79, 99

(56) References Cited

U.S. PATENT DOCUMENTS

| | | | | |
|---|---|---|---|---|
| 6,023,076 A | * | 2/2000 | Shibata | 257/94 |
| 6,376,866 B1 | * | 4/2002 | Shakuda | 257/103 |
| 6,459,100 B1 | * | 10/2002 | Doverspike et al. | 257/97 |
| 6,492,191 B2 | * | 12/2002 | Shibata et al. | 438/46 |
| 6,657,237 B2 | * | 12/2003 | Kwak et al. | 257/99 |
| 2002/0074561 A1 | * | 6/2002 | Sawaki et al. | 257/103 |

* cited by examiner

*Primary Examiner*—Jerome Jackson
*Assistant Examiner*—Joseph Nguyen
(74) *Attorney, Agent, or Firm*—Sughrue Mion, PLLC

(57) ABSTRACT

The present invention, a III-nitride light emitting diode (LED) and a manufacture method thereof, forms a magnetic metal layer in a conventional III-nitride LED by the method of thermal evaporation, e-beam evaporation, ion sputtering, or electroplate. Due to the eddy current effect, heat is generated by using electromagnetic oven inducing with electromagnetic wave to activate the p-type semiconductor material in III-nitride LED. The present invention has advantages of providing the equipments of simple structure and low cost. The contact resistance between the semiconductors and electrodes is reduced while the III-nitride compound semiconductor material is activated.

25 Claims, 2 Drawing Sheets

III-NITRIDE LIGHT EMITTING DIODE

FIELD OF THE INVENTION

The present invention relates to a III-nitride light emitting diode (LED) and a manufacturing method thereof. More particularly, the present invention relates to the structure and manufacturing method of III-nitride LED for activating the p-type III-nitride semiconductor material by using the heating method induced by electromagnetic wave.

BACKGROUND OF THE INVENTION

Nowadays, because LED has advantages of low manufacturing cost, low manufacturing difficulty level, easy and convenient installation and promising development future, LED is used widely in daily life, such as electronic bulletin boards, indicator lights and car taillights, etc.

FIG. 1 illustrates a cross-sectional view of a structure of conventional III-nitride LED. Referring to FIG. 1, there is an epitaxial structure 12 located on a substrate 10. The epitaxial structure 12 of a LED is composed of a plurality of III-V compound semiconductor layers, and the epitaxial structure 12 of a III-nitride LED is composed of a plurality of III-nitride compound semiconductor layers. Then, an ohmic contact metal electrode 14 and an ohmic contact metal electrode 16 are formed on the epitaxial structure 12, so as to form the LED structure, wherein the ohmic contact metal electrode 14 can be p-type or n-type, and the electrical property of the ohmic contact metal electrode 16 is opposite to that of the ohmic contact metal electrode 14.

In the epitaxial process, the p-type nitride semiconductor material of the III-nitride LED is first sufficiently doped, but most of the dopants are passivated by hydrogen. Hence, an additional activation-annealing step has to be performed in the process of manufacturing the III-nitride LED after the LED structure is formed, thereby increasing the doping concentration of the nitride semiconductor material. Generally, the activation-annealing step is performed by a heating method using a furnace or microwave oven, wherein the LED is put in a proper high temperature condition, and then the atoms in the material will be processed the rearrangement of crystal lattice after a certain period of time, so that the contact resistance between the semiconductor and the metal electrode is reduced.

SUMMARY OF THE INVENTION

With the conventional method performing the activation-annealing step by using a furnace or a microwave oven, the equipment cost is increased tremendously. Therefore, the present invention provides an activation-annealing step with an equipment of simple structure so as to reduce the cost of manufacturing III-nitride LED, and also to decrease the contact resistance between the semiconductor material and metal electrode.

According to the present invention, the structure of III-nitride LED comprises: a substrate; an epitaxial structure having a plurality of III-nitride compound semiconductor layers used for generating light when current enters, wherein one side of the epitaxial structure is connected to one side of the substrate, and a first ohmic contact metal electrode is located on another side of the epitaxial structure; and a magnetic metal layer for performing a heating step induced by electromagnetic wave to activate the III-nitride compound semiconductor layers.

The aforementioned magnetic metal layer is composed of the material selected from the group consisting of Fe, Co and alloy thereof. In the preferred embodiment, the aforementioned epitaxial structure includes, sequentially from the bottom to the top: a buffer layer; a semiconductor layer having a first electrical property; a first confining layer having the first electrical property; an active layer; a second confining layer having a second electrical property; and a contact layer having a second electrical property. In addition, the epitaxial structure further comprises a trench exposing a portion of a surface of the semiconductor layer, and a second ohmic contact metal electrode located on the portion of the surface of the semiconductor layer.

The present invention, the III-nitride LED and the method for making the same, has advantages of providing the equipments of simple structure and low cost, and simultaneously achieving the objects of both activating the III-nitride compound semiconductor material and reducing the contact resistance between the semiconductors and electrodes.

BRIEF DESCRIPTION OF THE DRAWINGS

The above features of the present invention will be more clearly understood from consideration of the following descriptions in connection with accompanying drawings in which.

DETAILED DESCRIPTION OF THE PREFERRED EMBODIMENT

The conventional method activates the semiconductor material layers by heating with a furnace or a microwave oven, and the equipment cost is increased therefore. The present invention provides a simple method to activate the p-type semiconductor material and reduce the contact resistance between the semiconductor and the metal electrode meanwhile. The present invention activates the p-type semiconductor material in the III-nitride LED by the electromagnetic wave inducing method, the method generating heat by eddy current.

Figure 1:
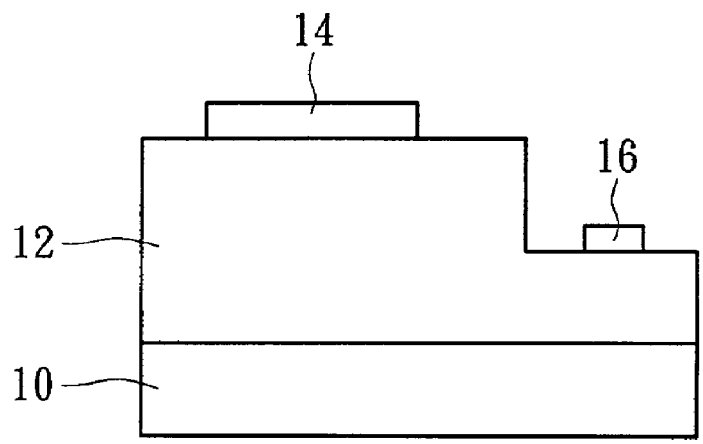
FIG. 1 illustrates a cross-sectional view of a structure of conventional III-nitride LED.
Figure 2A:
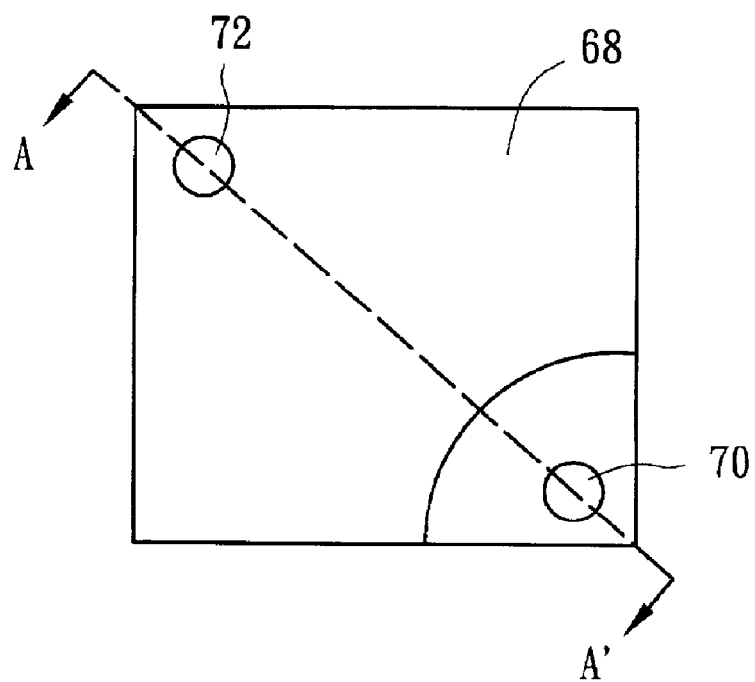
FIG. 2a illustrates a top view of a structure of III-nitride LED, according to the present invention.
Figure 2B:
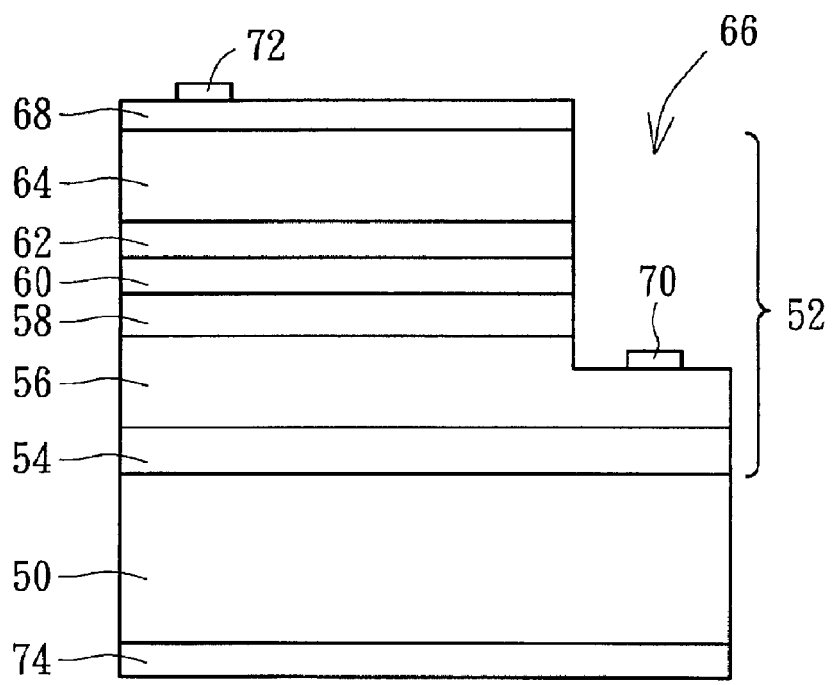
FIG. 2b illustrates a cross-sectional view of a structure of III-nitride LED along the A–A' line in the FIG. 2a, according to the present invention.

In the following description, the present invention is stated with preferred embodiments. FIG. 2a illustrates a top view of a structure of III-nitride LED, according to the present invention, and FIG. 2b illustrates a cross-sectional view of a structure of III-nitride LED along the A–A' line in the FIG. 2a, according to the present invention. Referring to the FIG. 2b first, a substrate 50, such as the sapphire substrate, is provided. Next, an epitaxial structure 52, composed of a plurality of III-nitride compound semiconductor layers, is formed on a side of the substrate 50 by using the method of metal organic chemical vapor deposition (MOCVD) or molecular-beam epitaxy (MBE). In a preferred embodiment, the epitaxial structure 52 comprises, sequentially from the bottom to the top: a buffer layer 54 composed of AlN or GaN; a semiconductor layer 56 having a first electrical property, the semiconductor layer 56 being composed of $(Al_xGa_{1-x})_yIn_{1-y}N$ ($0 \leq x \leq 1$; $0 \leq y \leq 1$); a confining layer 58 having the first electrical property, the confining layer 58 being composed $(Al_xGa_{1-x})_yIn_{1-y}N$ ($0 \leq x \leq 1$; $0 \leq y \leq 1$); an active layer 60 composed of a double hetero-junction structure and a quantum well of $(Al_xGa_{1-x})_yIn_{1-y}N$ ($0 \leq x \leq 1$; $0 \leq y \leq 1$); a confining layer 62 having a second electrical property, the confining layer 62 being composed $(Al_xGa_{1-x})_yIn_{1-y}N$ ($0 \leq x \leq 1$; $0 \leq y \leq 1$); and, a contact layer 64 having the second electrical property, the contact layer 64 being composed of $(Al_xGa_{1-x})_yIn_{1-y}N$ ($0 \leq x \leq 1$; $0 \leq y \leq 1$) with high doping.

Then, the epitaxial structure is etched or polished by using the method of dry etching, wet etching or mechanical cutting and polishing, in order to form a trench 66 exposing a portion of a surface of the semiconductor layer 56 having the first electrical property. Further, by using the method of the thermal evaporation, e-beam evaporation, or ion sputtering, a transparent electrode 68 having a second electrical property and a metal electrode pad 72 having the second electrical property are formed in the epitaxial structure 52, and a metal electrode pad 70 having the first electrical property is formed on the portion of the exposed surface of the semiconductor layer 56 having the first electrical property, wherein the first electrical property can be p-type or n-type, and the second electrical property is opposite to the first electrical property.

Then, a magnetic metal layer 74 composed of Fe, Co or alloy thereof, such as FeCoV or FeNi, is formed on another side of the substrate 50 by using the method of thermal evaporation, e-beam evaporation, ion sputtering, or electroplate, wherein the magnetic metal layer composed of Fe, Co, and FeCo alloy is preferred. The LED having the aforementioned structure is put onto electromagnetic oven which generates heat by the electromagnetic inducing way, so that, as a result of eddy current of magnetic metal layer 74, the p-type nitride semiconductor material is activated. Meanwhile, the metal electrode and the nitride semiconductor are annealed to reduce the contact resistance.

The principle of producing eddy current by electromagnetic inducement is described as follows: if a magnet is placed in opposite to a coin and is moved in parallel with the coin, the current of eddy pattern will be induced on the coin, and the current of eddy pattern is induced from the electromagnetic inducement. The magnetic flux of a surface from which the coin faces the magnet is changed due to the movement of magnet, and the current having concentric circles pattern is induced. The current, which has the shape of eddy, is named eddy current. Especially when the alternating current (AC) is used, the current alternates quickly. Thus, when a conductor is put on the alternating magnetic field, the magnetic flux passing on the conductor is also alternated quickly, so that it the eddy current is induced more apparently. The electromagnetic oven may use the internal electromagnetic coil to produce an alternating magnetic field, and the alternating magnetic field can make magnetic material generate the eddy current, and as a result, joule heat is generated to heat the magnetic material.

The characteristic of the present invention is to form a magnetic metal layer 74 on the structure of the III-nitride LED, wherein the magnetic metal layer 74 can be formed on the bottom, the flank or any position of the LED, and the present invention is not limited thereto. Hence, the principle of electromagnetic inducement is used to generate heat in order to activate the p-type semiconductor material, and to reduce the resistance between the semiconductor and the metal electrode. In a preferred embodiment of the present invention, if the substrate 50 is thinned before the magnetic metal layer 74 is formed, then the better heating effect of electromagnetic inducement can be attained.

Figure 3:
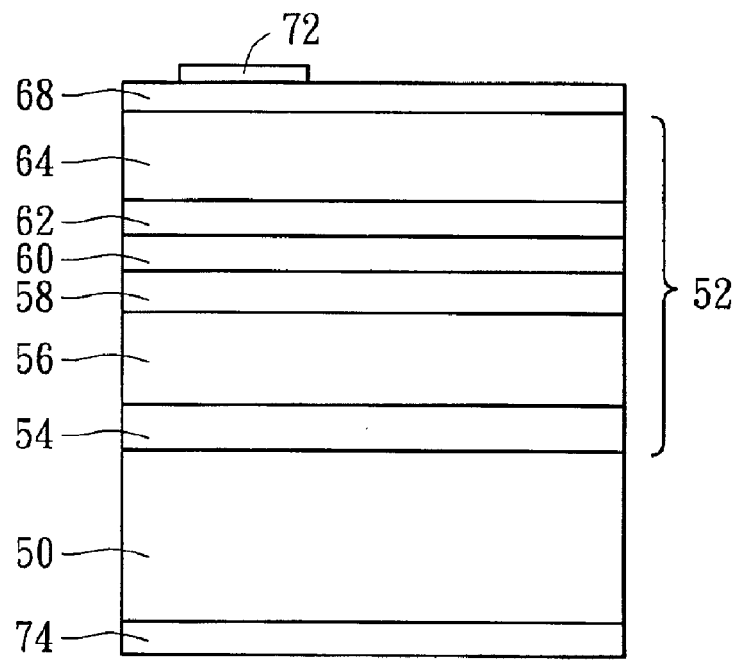
FIG. 3 illustrates a cross-sectional view of a structure of III-nitride LED, according to another embodiment of the present invention.

The structure of the present invention, the III-nitride LED having the magnetic metal layer, is not limited in the structure of FIG. 2b. Except the sapphire substrate, the substrate 50 can be made of SiC, GaAs, or silicon. If the substrate 50 is made of the material having the characteristics of high doping and high-conductivity, then it is not necessary to place all electrodes on the same side of the LED. That is to say, the etching or polishing step for forming the trench 55 can be skipped, and the magnetic metal layer 74 formed on another side of the substrate 50 is used to replace the first electrical metal electrode pad 70, such as shown in FIG. 3. However, for forming the aforementioned structure of FIG. 3, contact resistance between the magnetic metal layer 74 and the substrate 50 has to be low enough to enable the III-nitride LED.

It is noted that, the aforementioned varieties and forming sequences of the plurality of III-nitride compound semiconductor layers in the epitaxial structure, and the aforementioned number of the metal electrodes are merely stated as examples, and can be changed due to the difference of products, functions or processes, so that the present invention is not limited thereto. In addition, the material forming the substrate 50, the buffer layer 54, the first electrical semiconductor layer 56, the first electrical confining layer 58, the active layer 60, the second electrical confining layer 62, the second electrical contact layer 64 and the magnetic metal layer 74 is also stated as examples, and the present invention is not limited thereto.

The structure of III-nitride LED having the magnetic metal layer and the heating method of electromagnetic inducement provided by the present invention utilize the equipments of simple structure and low cost. Moreover, the present invention also reduces the contact resistance between the semiconductors and electrodes while activates the III-nitride compound semiconductor material.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A III-nitride LED, comprising:
    a substrate;
    an epitaxial structure having a plurality of III-nitride compound semiconductor layers used for generating light when current enters, wherein one side of the epitaxial structure is connected to one side of the substrate, a first ohmic contact metal electrode is located on the other side of the epitaxial structure, and the III-nitride compound semiconductor layers comprises at least one heat activated p-type III-nitride compound semiconductor layer; and
    an eddy current activated magnetic metal layer located on the other side of the substrate, for activating the III-nitride compound semiconductor layers in a heating step with an eddy current effect induced by electromagnetic wave, wherein the at least one heat activated p-type III-nitride compound semiconductor layer is formed in the heating step.

2. The III-nitride LED according to claim 1, wherein the substrate is composed of the material selected from a group consisting of sapphire, SiC, GaAs, and silicon.

3. The III-nitride LED according to claim 1, wherein the eddy current activated magnetic metal layer is composed of the material selected from a group consisting of Fe, Co, V, Ni and alloy thereof.

4. The III-nitride LED according to claim 1, wherein the eddy current activated magnetic metal layer is a second ohmic contact metal electrode, which has low metal-semiconductor contact resistance with the substrate having characteristics of high doping and high-conductivity.

5. The III-nitride LED according to claim 1, wherein the eddy current activated magnetic metal layer is located on another side of the substrate.

6. The III-nitride LED according to claim 1, wherein the epitaxial structure comprises a semiconductor layer having a first electrical property, and the semiconductor layer having the first electrical property is composed of $(Al_xGa_{1-x})_yIn_{1-y}N$ ($0 \leq x \leq 1$; $0 \leq y \leq 1$).

7. The III-nitride LED according to claim 6, wherein the structure further comprises a trench located on the other side of the epitaxial structure, in order to expose a portion of a surface of the semiconductor layer having the first electrical property, and a second ohmic contact metal electrode located on the portion of the surface of the semiconductor layer having the first electrical property.

8. The III-nitride LED according to claim 1, wherein the epitaxial structure comprises a buffer layer, and the buffer layer is composed of the material selected from a group consisting of AlN and GaN.

9. The III-nitride LED according to claim 1, wherein the epitaxial structure comprises a first confining layer having the first electrical property, and the first confining layer having the first electrical property is composed of $(Al_xGa_{1-x})_yIn_{1-y}N$ ($0 \leq x \leq 1$; $0 \leq y \leq 1$).

10. The III-nitride LED according to claim 1, wherein the epitaxial structure comprises an active layer, and the active layer is composed of the material selected from a group consisting of a double hetero-junction structure and a quantum well of $(Al_xGa_{1-x})_yIn_{1-y}N$ ($0 \leq x \leq 1$; $0 \leq y \leq 1$).

11. The III-nitride LED according to claim 1, wherein the epitaxial structure comprises a second confining layer having a second electrical property, and the second confining layer is composed of $(Al_xGa_{1-x})_yIn_{1-y}N$ ($0 \leq x \leq 1$; $0 \leq y \leq 1$).

12. The III-nitride LED according to claim 1, wherein the epitaxial structure comprises a contact layer having the second electrical property, and the contact layer having the second electrical property is composed of $(Al_xGa_{1-x})_yIn_{1-y}N$ ($0 \leq x \leq 1$; $0 \leq y \leq 1$).

13. A method of manufacturing III-nitride LED, comprising:
providing a substrate;
providing an epitaxial structure having a plurality of III-nitride compound semiconductor layers used for generating light when current enters, wherein one side of the epitaxial structure is connected to one side of the substrate, and the III-nitride compound semiconductor layers comprises at least one p-type III-nitride compound semiconductor layer;
forming a first ohmic contact metal electrode located on the other side of the epitaxial structure;
providing a magnetic metal layer on the other side of the substrate; and
heating the magnetic metal layer with an eddy current effect induced by electromagnetic wave for activating the at least one p-type III-nitride compound semiconductor layer of the III-nitride compound semiconductor layers.

14. The method of manufacturing III-nitride LED according to claim 13, wherein the substrate is composed of the material selected from a group consisting of sapphire, SiC, GaAs, and silicon.

15. The method of manufacturing III-nitride LED according to claim 13, wherein the magnetic metal is formed by the method selected from a group consisting of thermal evaporation, e-beam evaporation, ion sputtering, and electroplate.

16. The method of manufacturing III-nitride LED according to claim 13, wherein the magnetic metal layer is composed of the material selected from a group consisting of Fe, Co, V, Ni and alloy thereof.

17. The method of manufacturing III-nitride LED according to claim 13, wherein the magnetic metal layer is a second ohmic contact metal electrode, which has low metal-semiconductor contact resistance with the substrate having characteristics of high doping and high conductivity.

18. The method of manufacturing III-nitride LED according to claim 13, wherein the magnetic metal layer is located on another side of the substrate.

19. The method of manufacturing III-nitride LED according to claim 13, wherein the epitaxial structure comprises a semiconductor layer having a first electrical property, and the semiconductor layer having the first electrical property is composed of $(Al_xGa_{1-x})_yIn_{1-y}N$ ($0 \leq x \leq 1$; $0 \leq y \leq 1$).

20. The method of manufacturing III-nitride LED according to claim 19, wherein the structure further comprises a trench located on the other side of the epitaxial structure, in order to expose a portion of a surface of the semiconductor layer having the first electrical property, and a second ohmic contact metal electrode located on the portion of the surface of the semiconductor layer having the first electrical property.

21. The method of manufacturing III-nitride LED according to claim 13, wherein the epitaxial structure comprises a buffer layer, and the buffer layer is composed of the material selected from a group consisting of AlN and GaN.

22. The method of manufacturing III-nitride LED according to claim 13, wherein the epitaxial structure comprises a first confining layer having the first electrical property, and the first confining layer having the first electrical property is composed of $(Al_xGa_{1-x})_yIn_{1-y}N$ ($0 \leq x \leq 1$; $0 \leq y \leq 1$).

23. The method of manufacturing III-nitride LED according to claim 13, wherein the epitaxial structure comprises an active layer, and the active layer is composed of the material selected from a group consisting of a double hetero-junction structure and a quantum well of $(Al_xGa_{1-x})_yIn_{1-y}N$ ($0 \leq x \leq 1$; $0 \leq y \leq 1$).

24. The method of manufacturing III-nitride LED according to claim 13, wherein the epitaxial structure comprises a second confining layer having a second electrical property, and the second confining layer having the second electrical property is composed of $(Al_xGa_{1-x})_yIn_{1-y}N$ ($0 \leq x \leq 1$; $0 \leq y \leq 1$).

25. The method of manufacturing III-nitride LED according to claim 13, wherein the epitaxial structure comprises a contact layer having the second electrical property, and the contact layer having the second electrical property is composed of $(Al_xGa_{1-x})_yIn_{1-y}N$ ($0 \leq x \leq 1$; $0 \leq y \leq 1$).

* * * * *